United States Patent [19]

Yamazaki

[11] Patent Number: 4,806,797

[45] Date of Patent: Feb. 21, 1989

[54] BI-CMOS BUFFER CASCADED TO CMOS DRIVER HAVING PMOS PULL-UP TRANSISTOR WITH THRESHOLD VOLTAGE GREATER THAN VBE OF BI-CMOS BIPOLAR PULL-UP TRANSISTOR

[75] Inventor: Toru Yamazaki, Tokyo, Japan

[73] Assignee: NEC Corporation, Tokyo, Japan

[21] Appl. No.: 92,262

[22] Filed: Sep. 2, 1987

[30] Foreign Application Priority Data

Sep. 2, 1986 [JP] Japan .................................. 61-207112

[51] Int. Cl.⁴ ...................... H03K 17/16; H03K 17/56
[52] U.S. Cl. .................................... 307/446; 307/443; 307/451; 307/362; 307/570
[58] Field of Search ............... 307/443, 446, 448, 451, 307/362–363, 570, 270

[56] References Cited

U.S. PATENT DOCUMENTS

| | | | |
|---|---|---|---|
| 4,301,383 | 11/1981 | Taylor | 307/446 X |
| 4,682,054 | 7/1987 | McLaughlin | 307/446 |
| 4,694,202 | 9/1987 | Iwamura et al. | 307/451 X |
| 4,694,203 | 9/1987 | Uragami et al. | 307/446 |
| 4,701,642 | 10/1987 | Pricer | 307/446 |
| 4,730,132 | 3/1988 | Watanabe et al. | 307/451 X |

Primary Examiner—David Hudspeth
Attorney, Agent, or Firm—Sughrue, Mion, Zinn, Macpeak, and Seas

[57] ABSTRACT

For reduction in power consumption, there is disclosed a buffer circuit for a subsequent stage having a CMOS inverter circuit with a preselected threshold voltage coupled between a positive voltage source and a source of ground voltage comprising an input node to which an input signal appears, an output node coupled to the gate electrodes of the CMOS inverter circuit, and a n-p-n type bipolar transistor having a base electrode coupled to the input node, an emitter electrode coupled to the output node and a collector electrode coupled to the source of positive voltage, the bipolar transistor provides a conduction path from the source of positive voltage to the output node when the bipolar transistor is turned on, and the output node is electrically connected to the source of ground voltage when the bipolar transistor is turned off, wherein the bipolar transistor turns on in the presence of a preselected difference voltage between the emitter electrode and the base electrode and the preselected difference voltage is smaller in value than the preselected threshold voltage, so that the CMOS inverter circuit is prevented from a conduction path passing therethrough.

9 Claims, 3 Drawing Sheets

BI-CMOS BUFFER CASCADED TO CMOS DRIVER HAVING PMOS PULL-UP TRANSISTOR WITH THRESHOLD VOLTAGE GREATER THAN VBE OF BI-CMOS BIPOLAR PULL-UP TRANSISTOR

FIELD OF THE INVENTION

This invention relates to a buffer circuit and, more particularly, to a bi-CMOS implementation of a buffer circuit.

BACKGROUND OF THE INVENTION

In general, a CMOS inverter circuit comprises a series of complementary component MOS field effect transistors and one of the component transistors is non-conductive in either logic state. Then, a small amount of leakage current flows in either steady state and, for this reason, the low power consumption is the most attractive feature of the CMOS inverter circuit but the CMOS inverter circuit suffers from a limited switching speed. On the other hand, a bipolar transistor can drive a capacitive load with much less speed degradation but consumes a large amount of power. In short, there is a trade-off between power and speed. A particular attention is being paid to bi-CMOS circuits as a compromise between power and speed.

A typical example of the bi-CMOS circuit is illustrated in FIG. 1 of the drawings. The bi-CMOS circuit illustrated in FIG. 1 serves as a buffer circuit and comprises a CMOS inverter circuit 1 consisting of a p-channel type MOS field-effect transistor 2 and an n-channel type MOS field-effect transistor 3, a source follower circuit 4 consisting of an n-channel type MOS field-effect transistor 5 and a resistor 6, and a series combination of n-p-n bipolar transistors 7 and 8 coupled between a source of positive voltage 9 of 5.0 volt and a ground terminal. The CMOS inverter circuit 1 is also coupled between the source of positive voltage 9 and the ground terminal and has a common drain node 10 which is coupled to the base electrode of the n-p-n bipolar transistor 7. The source follower circuit 4 is coupled between the collector electrode of the n-p-n bipolar transistor 8 and the ground terminal and has an output node 11 coupled to the base electrode of the n-p-n bipolar transistor 8. The buffer circuit illustrated in FIG. 1 further has an input terminal 12 connected in parallel to the respective gate electrodes of the MOS filled-effect transistors 2, 3 and 5 so that the CMOS inverter circuit 1 shifts the n-p-n bipolar transistor 7 between on and off states to produce an output signal of high or low voltage level at an output node 13 depending upon the voltage level of the input node 12, and, on the other hand, the source follower circuit 4 drives the n-p-n bipolar transistor 8 so as to cause the output node 13 to rapidly go down to the low voltage level. In this example, when a certain forward-biased voltage $V_{EB}$ ranging between 0.6 volt and 0.8 volt is applied to the emitter-base junction of the bipolar transistor 7, the bipolar transistor 7 turns on to provide a current path from the source of positive voltage 9 to the output node 13. Similarly, the n-p-n bipolar transistor 8 turns on to provide a current path from the output node 13 to the ground when the certain forward-biased voltage is applied to the emitter-base junction thereof. The output node 13 is coupled to a CMOS inverter circuit 14 of the subsequent stage consisting of a p-channel type MOS field-effect transistor 15 and an n-channel type MOS field-effect transistor 16 so that the n-p-n bipolar transistors 7 and 8 drives the CMOS inverter circuit 14 of the subsequent stage. The p-channel type MOS field-effect transistor 15 has a certain threshold voltage $V_{TH}$ ranging between $-0.5$ volt and 0.8 volt, then the MOS field-effect transistor 15 turns on when a certain positive voltage level ranging between 4.2 volt and 4.5 volt appears at the output node 13. The n-channel type MOS field-effect transistor 16 has a certain threshold voltage ranging between 0.5 volt and 0.8 volt, then the MOS field-effect transistor 16 is turned on if the output node 13 has a positive voltage level higher than the threshold voltage of the MOS field-effect-transistor 16.

Another example of the prior-art bi-CMOS circuit is illustrated in FIG. 2. The bi-CMOS circuit illustrated in FIG. 2 also serves as a buffer circuit and comprises a 2-input NAND gate 21 consisting of p-channel type MOS field-effect transistors 22 and 23 coupled in parallel between a source of positive voltage level 24 and an output node 25 thereof and a series combination of n-channel type MOS field-effect transistors 26 and 27 coupled between the output node 25 and a ground terminal, a source follower circuit 28 consisting of a series combination of two n-channel type MOS field-effect transistors 29 and 30 and a resistor 31, and a series combination of n-p-n bipolar transistors 32 and 33 coupled between the source of positive voltage level 24 and the ground terminal. The output node 25 is coupled to the base electrode of the n-p-n bipolar transistor 32 and an output node 34 of the source follower circuit 28 is connected to the base electrode of the n-p-n bipolar transistor 33. Between the n-p-n bipolar transistors 32 and 33 is provided an output node 35 of the buffer circuit which supplies a current to a capacitive load CL of the subsequent stage. The capacitive load CL is usually formed by parasitic gate capacitances of MOS field-effect transistors forming the subsequent stages. The 2-input NAND gate 21 and the source follower circuit 28 are coupled in parallel to input nodes 36 and 37 so that the n-p-n bipolar transistor 32 is shifted between on and off states depending upon the voltage levels of the input nodes 36 and 37. In thermal equilibrium condition, each of the bipolar transistors 32 and 33 has a built-in potential of the emitter-base junction approximately equal to that of the bipolar transistor 7 or 8, and each of the MOS field-effect transistors forming part of the subsequent stage also has a threshold voltage approximately equal to that of the MOS field-effect transistor 15 or 16. A modification of the buffer circuit illustrated in FIG. 2 is disclosed by H. Higuchi et al in "PERFORMANCE AND STRUCTURE OF SCALED-DOWN BIPOLAR DEVICES MERGED WITH CMOSFETS", IEDM 84, 694–697. In the modification disclosed in the above paper the resistor 31 is replaced by a MOS field-effect transistor provided with a gate electrode connected to the output node of a 2-input NAND gate corresponding to the NAND gate 21.

A problem has been encountered in the buffer circuits illustrated in FIGS. 1 and 2 and the modification in a high through current or a leakage current caused by simultaneous on states of the MOS field-effect transistors forming the subsequent stage. Focusing on the buffer circuit illustrated in FIG. 1, the problem inherent in the prior-art buffer circuits will be hereinunder described in detail.

When the input terminal 12 has a certain positive high voltage level, the n-channel type MOS field-effect transistors 3 and 5 are turned on but the p-channel type MOS field-effect transistor 1 is turned off, so that the output nodes 10 and 11 have a certain low voltage level. This results in that both of the n-p-n bipolar transistors 7 and 8 remain in the off states, respectively. The parasitic gate capacitance CL coupled to the output node 13 has been sufficiently discharged so that a low voltage level approximately equal to the ground level appears at the output node 13. With the low voltage level approximately equal to the ground level, a current path is provided from the source of positive voltage level 9 to an output node of the CMOS inverter circuit 14 by turning the MOS field-effect transistor 15 on and turning the MOS field-effect transistor 16 off, thereby producing an output signal of a certain high voltage level.

However, when the input terminal 12 goes down to a certain low voltage level, the n-channel type MOS field-effect transistors 3 and 5 turn off and, on the other hand, the p-channel type MOS field-effect transistor 2 turns on. These switching operations cause the output node 10 to go up toward a certain high voltage level, but the output node 11 remains in the low voltage level to keep the n-p-n bipolar transistor 8 off. With the certain positive voltage level appearing at the output node 10, the n-p-n bipolar transistor 7 turns on to supply a current to the output node 13, then the parasitic gate capacitance CL is fully accumulated. When the parasitic gate capacitance CL is fully accumulated, the output node 13 reaches the certain positive voltage level lower than the source of positive voltage level of 5.0 volt by the emitter-base voltage $V_{EB}$. The emitter-base voltage $V_{EB}$ is selected to have a value ranging between 0.6 volt and 0.8 volt so that the certain positive voltage level has a value ranging between 4.2 volt and 4.4 volt. The output node 13 is high enough to cause the n-channel type MOS field-effect transistor 16 to turn on. However, a difference voltage ranging between 0.6 volt and 0.8 volt takes place between the source of positive voltage 9 and the output node 13 when the n-channel MOS field-effect transistor 16 begins to turn on. As described hereinbefore, the p-channel type MOS field-effect transistor 15 has the threshold voltage ranging between $-0.5$ volt and $-0.8$ volt so that the p-channel MOS field-effect transistor 15 momentary remains in the on state. The simultaneous on states of the MOS field-effect transistors 15 and 16 allow the through current to flow from the source of positive voltage level 9 to the ground terminal. The p-channel type MOS field-effect transistor 15 is turned on for a while and goes to the off state to cut off the current path. On the other hand, when the input terminal 12 goes up to the certain positive voltage level again, the n-channel type MOS field effect transistors 3 and 5 turn on and the p-channel type MOS field-effect transistor 2 turns off. Then, the output node 10 goes down toward the ground level and the n-p-n bipolar transistor 7 turns off to cut off the current path from the source of positive voltage 9 to the output node 13. As the n-channel type MOS field-effect transistor 5 provides a current path from the output node 13 to the ground terminal, the parasitic gate capacitance CL is discharged therethrough. This results in increasing in voltage level at the output node 11. When the voltage level at the output node 11 reaches the emitter-base voltage $V_{EB}$ of the n-p-n bipolar transistor 8, the n-p-n bipolar transistor 8 turns on to rapidly discharge the parasitic gate capacitance CL. During the discharge of the parasitic capacitance CL, the output node 13 is clamped at a voltage level approximately equal to the emitter-base voltage level $V_{EB}$ with respect to the ground level. Then, the n-channel type field-effect transistor 16 remains in the on state. As the p-channel type MOS field-effect transistor 15 has already turned on, a current path is established between the source of positive voltage 9 and the ground terminal and the through current flows. After the discharge of the parasitic gate capacitance CL the n-channel type MOS field-effect transistor 16 turns off to cut off the current path. This results in increasing in power consumption.

It is therefore an important object of the present invention to provide a buffer circuit which is substantially free from the through current or leakage current.

SUMMARY OF THE INVENTION

To accomplish the above object, the present invention proposes to select a threshold voltage of a MOS field-effect transistor which is larger in value than a built-in potential at the emitter-base junction of a bipolar transistor.

In accordance with one aspect of the present invention, there is provided a buffer circuit for a subsequent stage having a series combination of first and second field-effect transistors different in conductivity type from each other and coupled between first and second sources of voltage, the first field-effect transistor having a preselected threshold voltage comprising (a) an input node to which an input signal appears, (b) an output node coupled in parallel to respective gate electrodes of the first and second field-effect transistors, and (c) a bipolar transistor having a base electrode coupled to the input node, an emitter electrode coupled to the output node and a collector electrode coupled to the first source of voltage, the bipolar transistor provides a conduction path from the first source of voltage to the output node when the bipolar transistor is turned on, and the output node is electrically connected to the second source of voltage when the bipolar transistor is turned off, wherein the bipolar transistor turns on in the presence of a preselected difference voltage between the emitter electrode and the base electrode, and the preselected difference voltage is smaller in value than the preselected threshold voltage.

In accordance with another aspect of the present invention, there is proposed a buffer circuit for a subsequent stage having a series combination of a first load transistor and a second field-effect transistor coupled between first and second sources of voltage producing respective voltage level different from each other, the second field-effect transistor having a preselected threshold voltage, comprising, (a) a series combination of first and second bipolar transistors coupled between the first and second sources of voltage, the second bipolar transistor turning on when a preselected difference voltage is applied between base and emitter electrodes thereof, (b) an output node coupled to a gate electrode of the second field-effect transistor, (c) a logic gate coupled between the first and second sources of voltage and producing a first signal applied to a base electrode of the first bipolar transistor, and (d) a source follower circuit coupled between the output node and the second source of voltage and producing a second signal applied to the base electrode of the second bipolar transistor, wherein the preselected difference voltage is smaller in value than the preselected threshold voltage.

BRIEF DESCRIPTION OF THE DRAWINGS

The features and advantages of a buffer circuit according to the present invention will be more clearly understood from the following description taken in conjunction with the accompanying drawings in which.

DESCRIPTION OF THE PREFERRED EMBODIMENTS

First Embodiment

Figure 1:
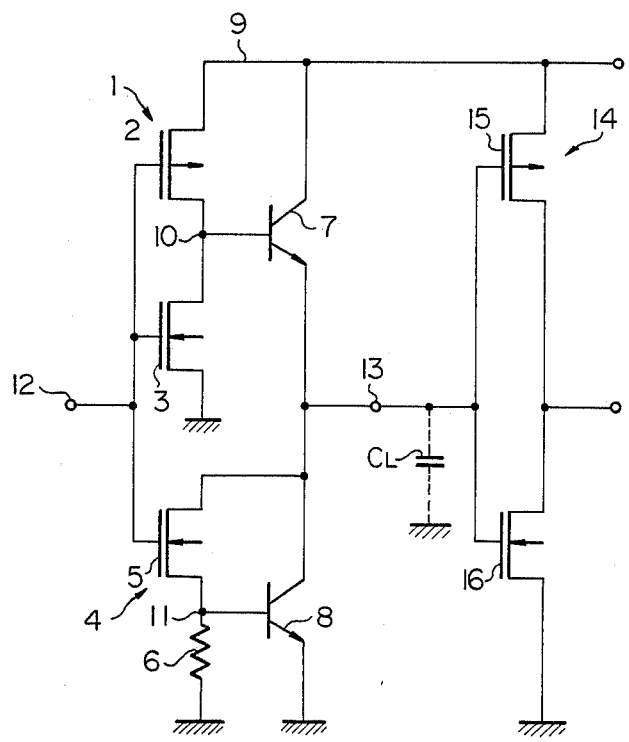
FIG. 1 is a diagram showing the circuit arrangement of a typical example of a prior-art buffer circuit.
Figure 2:
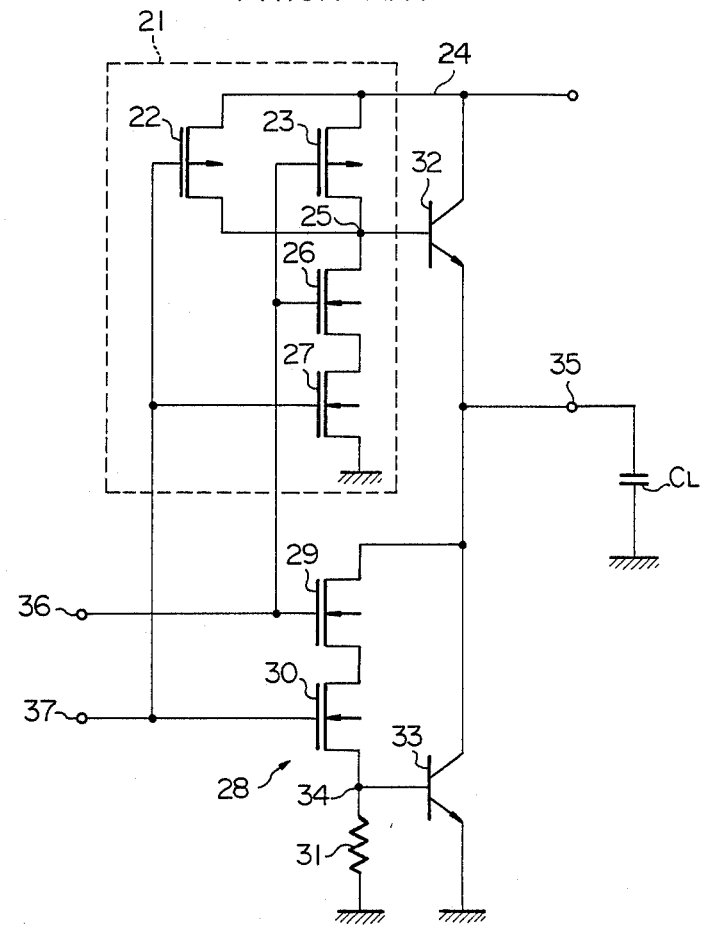
FIG. 2 is a diagram showing the circuit arrangement of another prior-art buffer circuit.
Figure 3:
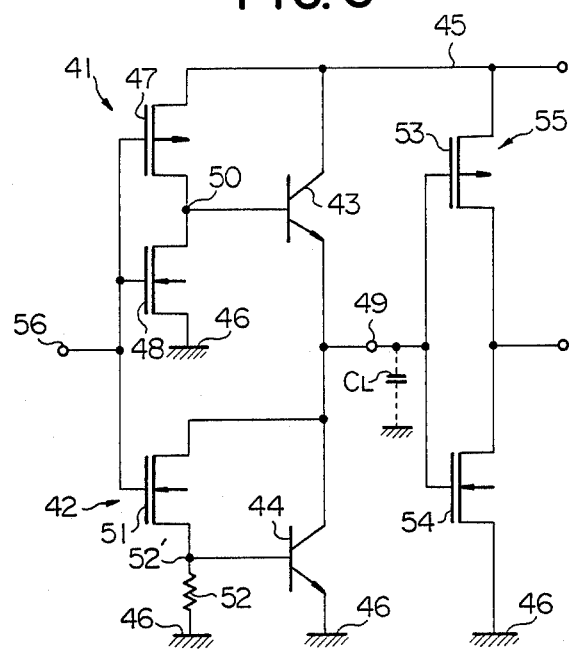
FIG. 3 is a diagram showing the circuit arrangement of a first embodiment according to the present invention.

Referring to FIG. 3 of the drawings, there is shown the cicuit arrangement of a buffer circuit embodying the present invention. The buffer circuit illustrated in FIG. 3 comprises a CMOS inverter circuit 41, a source follower circuit 42, and a series combination of n-p-n type bipolar transistors 43 and 44. The series combination of the n-p-n type bipolar transistors 43 and 44 is coupled between a source of positive voltage 45 of about 5.0 volt and a source of ground voltage 46 and an output node 49 of the buffer circuit is provided between the two n-p-n bipolar transistors 43 and 44. The CMOS inverter circuit 41 is also coupled between the source of positive voltage 45 and the source of ground voltage 46 and has a p-channel type MOS field-effect transistor 47 and an n-channel type MOS field-effect transistor 48 connected in series. The common drain node serves as an output node 50 of the CMOS inverter circuit 41 which is coupled to a base electrode of the n-p-n bipolar transistor 43. On the other hand, the source follower circuit 42 is coupled between the output node 49 and the source of ground voltage 46 and has a series combination of an n-channel type MOS field-effect transistor 51 and a resistor 52. An output node 52' of the source follower circuit 42 is provided between the n-channel type MOS field-effect transistor 51 and the resistor 52 and is coupled to a base electrode of the n-p-n bipolar transistor 44. In this instance, the n-p-n bipolar transistor 43 has a built-in potential Vbi of a preselected value of about 0.6 volt at the emitter-base junction. Then, the output node 49 goes up to a certain voltage level of about 4.4 volt when the n-p-n bipolar transistor 53 is turned on. However, the preselected value may be selected to be between about 0.6 volt and about 0.8 volt in another implementation using, for example, compound semiconductor materials.

The output node 49 is coupled in parallel to respective gate electrodes of a p-channel type MOS field-effect transistor 53 and an n-channel type MOS field-effect transistor 54. The p-channel type MOS field-effect transistor 53 and the n-channel type MOS field-effect transistor 54 are connected in series and are provided between the source of positive voltage 45 and the source of ground voltage 46. The series combination of the MOS field-effect transistors 53 and 54 form in combination a CMOS inverter circuit 55 of the subsequent stage. The p-channel type MOS field-effect transistor 53 has a preselected threshold voltage $V_{TH}$ larger in value than the built-in potential of the n-p-n bipolar transistor 43 by about 0.1 volt. The preselected threshold voltage $V_{TH}$ may be controlled by changing the impurity atom concentration in the channel region thereof, changing the thickness of the gate insulating film or changing material of the gate electrode. Then, the p-channel type MOS field-effect transistor 53 turns off when the output node 49 goes up to about 4.3 volt. However, a difference voltage between the built-in potential of the n-p-n bipolar transistor 43 and the p-channel type MOS field-effect transistor 53 may be selected to be between about 0.1 volt and about 0.3 volt in another implementation. If the difference voltage is selected within the range, a leakage current is sufficiently reduced without deterioration in high speed operation. An input signal appears at an input node 56 which is coupled in parallel to respective gate electrodes of MOS field-effect transistors 47, 48 and 51. In this instance, the n-channel type MOS field-effect transistor 54 has a threshold voltage larger in value than a built-in voltage of the n-p-n bipolar transistor 44.

In operation, when the input node 56 has a certain positive high voltage level, the n-channel type MOS field-effect transistors 48 and 51 are turned on but the p-channel type MOS field-effect transistor 47 is turned off, so that the output nodes 50 and 52' have a certain low voltage level. This results in that both of the n-p-n bipolar transistors 43 and 44 remain in off states, respectively. A parasitic gate capacitance CL of the CMOS inverter circuit 55 is discharged. A low voltage level approximately equal to the ground level appears at the output node 49 so that a current path is provided from the source of positive voltage 45 to an output node of the CMOS inverter circuit 55 by turning the p-channel type MOS field-effect transistor 53 on and turning the n-channel MOS transistor off, thereby producing an output signal of a certain high voltage level.

When the input node 56 goes down to a certain low voltage level, the n-channel type MOS field-effect transistors 48 and 51 turn off, but the p-channel MOS field-effect transistor 47 turns on. These switching operations cause the output node 50 to go up toward a certain high voltage level, but the output node 52' remains low to keep the n-p-n bipolar transistor 44 off. When the voltage level at the output node 50 reaches the built-in potential of the n-p-n bipolar transistor 43, the n-p-n bipolar transistor 43 turns on, then the collector current charges up the parasitic gate capacitance CL of the subsequent stage formed by the MOS field-effect transistors 53 and 54. When the parasitic capacitance CL coupled to the output node 49 is fully accumulated, the output node 49 reaches the certain positive voltage level of about 4.4 volt. The output node 49 is high enough to cause the n-channel type MOS field-effect transistor 54 to turn on so that the n-channel type MOS field-effect transistor 54 provides a conduction path from the output node of the CMOS inverter circuit 55 to the source of ground voltage 46. This results in that the output node of the CMOS inverter circuit 55 rapidly goes down to the ground level. As described hereinbefore, the p-channel MOS field-effect transistor 53 has the preselected threshold voltage $V_{TH}$ larger in value than the built-in potential by about 0.1 volt so that the p-channel MOS field-effect transistor 53 is fully turned off even if the output node 49 reaches the certain positive voltage level of about 4.4 volt. The series combination of the MOS field-effect transistors 53 and 54 are thus prevented from the simultaneous on states so that no conduction path is established between the source of positive voltage 45 and the source of ground voltage 46. This results in reduction in power consumption. When the input signal applied to the input node 56 goes up to the certain positive high voltage level again, the output node 49 is clamped at the built-in voltage of the n-p-n bipolar transistor 44 for a while. However, the n-channel type MOS field-effect transistor 54 has the threshold voltage larger in value than the built-in voltage so that the n-channel type MOS field-effect transistor 54 remains in the off state, thereby preventing the CMOS inverter circuit 55 from a conduction path from the source of positive voltage 45 to the ground terminal 46. Then, the power consumption of the circuit illustrated in FIG. 3 is drastically reduced.

In fact, when the built-in potential Vbi and the threshold voltage $V_{TH}$ are selected to be 0.7 volt and 1.0 volt, respectively, a leakage current is reduced to be on the order of 0.001 percent in comparison with the prior-art circuit having a MOS field-effect transistor with a threshold voltage identical with the built-in potential of the bipolar transistor.

The buffer circuit illustrated in FIG. 3 is implemented by bipolar-CMOS inverter combination, however if a light capacitive load is coupled to the output node 49 of the buffer circuit, the buffer circuit can be arranged in such a manner that the CMOS inverter circuit 41 directly drives the light capacitive load. Then, if an integrated circuit has a plurality of buffer circuits some of which should drive heavy capacitive loads, respectively, but the others of which are coupled to light capacitive loads, respectively, each of the buffer circuits coupled to the heavy capacitive load is designed to have a circuit arrangement similar to that of the buffer circuit illustrated in FIG. 3, but the other buffer circuits can be arranged without bipolar transistors. This circuit arrangement results in reduction in chip size.

Second Embodiment

Figure 4:
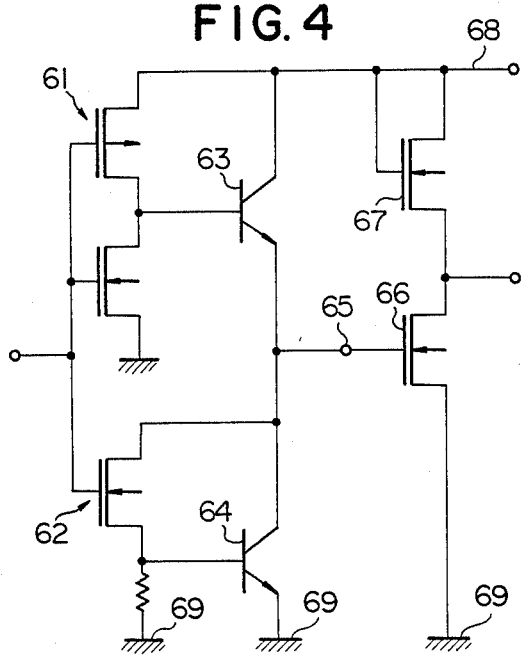
FIG. 4 is a diagram showing the circuit arrangement of a second embodiment according to the present invention.

Turning to FIG. 4 of the drawings, another circuit arrangement of a buffer circuit embodying the present invention is illustrated and comprises a CMOS inverter circuit 61, a source follower circuit 62 and a series combination of n-p-n bipolar transistors 63 and 64. The CMOS inverter circuit 61 and the source follower circuit 62 are similar in circuit configuration to the CMOS inverter circuit 41 and the source follower circuit 42, respectively. Then, detailed description for those circuits are omitted for the sake of simplicity. The buffer circuit has an output node 65 coupled to a gate electrode of an n-channel type MOS field-effect transistor 66, and the n-channel type field-effect transistor 66 is connected in series to an n-channel type MOS field-effect transistor 67 which has a gate electrode connected to a source electrode thereof. The series of two n-channel type MOS field-effect transistors 66 and 67 are coupled between a source of positive voltage source 68 and the source of ground voltage 69. Then, the n-channel MOS field-effect transistor 67 serves as a load transistor. In this instance, the n-p-n bipolar transistor 64 has a built-in potential Vbi of about 0.6 volt so that the output node 65 has a voltage level of about 4.4 volt when the n-p-n bipolar transistor 64 is turned on. The n-channel type MOS field-effect transistor 66 has a threshold voltage $V_{TH}$ larger in value than a built-in potential Vbi of the bipolar transistor 63 by 0.1 volt so that the n-channel type MOS field-effect transistor 66 is in off state when the n-p-n bipolar transistor 64 causes the output node 65 to be 4.4 volt. Then, the buffer circuit illustrated in FIG. 4 is prevented from a conduction path from the source of positive voltage 68 to the source of ground voltage. This results in reduction in power consumption. The built-in voltage Vbi may be selected to be between about 0.6 volt and 0.8 volt and the threshold voltage may be selected to be larger in value than the built-in potential by a value ranging between 0.1 volt and 0.3 volt in another implementation using, for example, another semiconductor material.

In the buffer circuits illustrated in FIGS. 3 and 4, the MOS field-effect transistors 53 and 66 has the respective threshold voltages larger in value than the respective built-in potentials of the bipolar transistors 43 and 63 by the values each ranging between 0.1 volt and 0.3 volt. However, each difference voltage between the threshold voltage and the built-in potential fluctuates depending upon applied circuits, then the difference voltage may be selected to be out of the range between 0.1 volt and 0.3 volt.

Although particular embodiment of the present invention have been shown and described, it will be obvious to those skilled in the art that various changes and modifications may be made without departing from the spirit and scope of the present invention.

What is claimed is:

1. A buffer circuit for a subsequent stage having a series combination of first and second field-effect transistors different in channel conductivity type from each other and coupled between first and second sources of voltage, said first field-effect transistor having a preselected threshold voltage, comprising:
   (a) an input node to which an input signal is applied;
   (b) an output node coupled to respective gate electrodes of said first and second field-effect transistors;
   (c) a bipolar transistor having a base electrode coupled to said input node, an emitter electrode coupled to said output node and a collector electrode coupled to said first source of voltage, said bipolar transistor providing a conduction path from said first source of voltage to said output node when the bipolar transistor is turned on; and
   (d) switch means coupled between said output node and said second source of voltage to receive said input signal from said input node, said switch means electrically connecting said output node to said second source voltage when said bipolar transistor is turned off, wherein said bipolar transistor turns on in the presence of a preselected difference voltage between the emitter electrode and the base electrode, said preselected difference voltage being smaller in value than said preselected threshold voltage.

2. A buffer circuit as set forth in claim 1, in which said bipolar transistor is of an n-p-n type and turns on when a preselected difference voltage ranging from 0.6 volt and 0.8 volt is applied between the emitter electrode and the base electrode.

3. A buffer circuit as set forth in claim 2, in which said first field-effect transistor is of a p-channel type and turns on when said preselected threshold voltage larger in value than said preselected difference voltage by a value ranging between 0.1 and 0.3 volt is applied thereto.

4. A buffer circuit as set forth in claim 1, in which said buffer circuit further comprises a logic gate coupled between said first and second sources of voltage and produces said input signal appearing at said input node.

5. A buffer circuit as set forth in claim 4, in which said logic gate has a series combination of third and fourth field-effect transistors different in channel conductivity type from each other and complementarily shifted between on and off states to produce said input signal appearing at said input node.

6. A buffer circuit as set forth in claim 4, said buffer circuit further comprises a source follower circuit coupled between said output node and said second source of voltage, and an additional bipolar transistor coupled between said output node and said second source of voltage and driven by the source follower circuit.

7. A buffer circuit as set forth in claim 6, in which said source follower circuit has a series combination of a fifth field-effect transistor and a resistor.

8. A buffer circuit for a subsequent stage having a series combination of a first p-channel type field-effect transistor and a second n-channel type field-effect transistor and coupled between a source of positive voltage and a source of ground voltage, said first p-channel type field-effect transistor having a preselected threshold voltage, comprising:
  (a) a series combination of a first n-p-n type bipolar transistor and a second n-p-n type bipolar transistor coupled between said source of positive voltage and said source of ground voltage, said first n-p-n bipolar transistor turning on when a preselected difference voltage is applied between emitter and base electrodes thereof;
  (b) an output node provided between said first n-p-n bipolar transistor and said second n-p-n bipolar transistor;
  (c) a logic gate having a series combination of a third p-channel type field-effect transistor and a fourth n-channel type field-effect transistor and a common drain node coupled to a base electrode of said first n-p-n bipolar transistor, and coupled between said souce of positive voltage and said source of ground voltage;
  (d) a source follower circuit having a series combination of a fifth n-channel type field-effect transistor and a resistor, and coupled between said output node and said source of ground voltage, said fifth n-channel field-effect transistor having a source node coupled to a base electrode of said second n-p-n bipolar transistor; and
  (e) an input node receiving an input signal, said third, fourth and fifth field-effect transistors being coupled to said input node, wherein said preselected difference voltage has a value ranging between 0.6 volt to 0.8 volt which is smaller than said preselected threshold voltage by a value ranging between 0.1 volt and 0.3 volt.

9. A buffer circuit for a subsequent stage having a series combination of a first load transistor and a second field-effect transistor coupled between first and second sources of voltage producing respective voltage level different from each other, said second field-effect transistor having a preselected threshold voltage, comprising:
  (a) a series combination of first and second bipolar transistors coupled between said first and second sources of voltage, said second bipolar transistor turning on when a preselected difference voltage is applied between base and emitter electrodes thereof;
  (b) an output node coupled to a gate electrode of said second field-effect transistor;
  (c) a logic gate coupled between said first and second sources of voltage and producing a first signal applied to a base electrode of said first bipolar transistor; and
  (d) a source follower circuit coupled between said output node and said second source of voltage and producing a second signal applied to the base electrode of said second bipolar transistor, wherein said preselected difference voltage is smaller in value than said preselected threshold voltage.

* * * * *

UNITED STATES PATENT AND TRADEMARK OFFICE
CERTIFICATE OF CORRECTION

PATENT NO. : 4,806,797
DATED : February 21, 1989
INVENTOR(S) : TORU YAMAZAKI

It is certified that error appears in the above-identified patent and that said Letters Patent is hereby corrected as shown below:

Col. 2, line 4, delete "0.8" and insert -- -0.8--.

Col. 3, line 2, delete "certainlow" and insert --certain low--.

Signed and Sealed this

Third Day of October, 1989

Attest:

DONALD J. QUIGG

Attesting Officer

Commissioner of Patents and Trademarks